United States Patent
Tian et al.

(10) Patent No.: US 7,609,049 B1
(45) Date of Patent: Oct. 27, 2009

(54) ACCURATE SCAN-MODE VOLTAGE DETECTION CIRCUIT

(75) Inventors: Wenbo Tian, Beijing (CN); Hang Yin, Beijing (CN); Wang Zhao, Beijing (CN)

(73) Assignee: Vimicro Corporation, Beijing (CN)

( * ) Notice: Subject to any disclaimer, the term of this patent is extended or adjusted under 35 U.S.C. 154(b) by 42 days.

(21) Appl. No.: 12/127,824

(22) Filed: May 28, 2008

(51) Int. Cl.
  *G01R 19/00* (2006.01)
  *G01R 31/08* (2006.01)
  *G01R 27/08* (2006.01)
(52) U.S. Cl. ............ 324/76.11; 324/522; 324/713
(58) Field of Classification Search ........... 324/76.11, 324/522, 71.1, 713, 429; 361/30, 79, 86, 361/56, 91.1; 340/636.12, 636.15; 327/78, 327/81; 330/255, 288
See application file for complete search history.

(56) References Cited

U.S. PATENT DOCUMENTS

| | | | | |
|---|---|---|---|---|
| 5,144,248 A | * | 9/1992 | Alexandres et al. ......... 324/428 |
| 5,438,270 A | * | 8/1995 | Harper et al. ............... 324/429 |
| 5,614,807 A | * | 3/1997 | Duley ..................... 340/636.15 |
| 5,673,002 A | * | 9/1997 | Kobayashi et al. .......... 330/288 |
| 5,747,978 A | * | 5/1998 | Gariboldi et al. ............ 323/313 |
| 5,814,995 A | * | 9/1998 | Tasdighi .................... 324/431 |
| 5,969,574 A | * | 10/1999 | Legates ...................... 330/288 |
| 7,034,581 B2 | * | 4/2006 | Sudou ......................... 327/77 |
| 7,417,438 B2 | * | 8/2008 | Miyamoto ................... 324/522 |
| 7,480,126 B2 | * | 1/2009 | Cetrulo et al. ............. 361/91.1 |
| 2006/0139008 A1 | * | 6/2006 | Park ........................... 320/134 |
| 2006/0261823 A1 | * | 11/2006 | Parker ........................ 324/713 |

* cited by examiner

*Primary Examiner*—Hoai-An D Nguyen
(74) *Attorney, Agent, or Firm*—Joe Zheng

(57) ABSTRACT

A scan mode is used in a voltage detection circuit. An oscillator in the circuit is always on and a system including the voltage detection circuit detects various abnormal conditions, such as overcharging, overdischarging and overcurrent one by one for some clocks. To reduce the power consumption, the voltage detection circuit is turned on only once for several clocks. The on-time is very short and lasts about only one tenth of a clock cycle time. In other times, the voltage detection circuit is turned off to save power consumption.

13 Claims, 3 Drawing Sheets

ACCURATE SCAN-MODE VOLTAGE DETECTION CIRCUIT

BACKGROUND OF THE INVENTION

1. Field of the Invention

The present invention relates to a battery protection circuit, more particularly to an accurate scan-mode voltage detection circuit.

2. Description of Related Art

It is well known that a Lithium ion battery has been used as a battery cell in a battery pack. The Lithium ion battery generates a high energy density per weight and volume, and generally provides a reduction in size and weight of a portable type apparatus. However, the Lithium ion battery has a safety problem that its performance characteristic is degraded when it is charged by an overvoltage, and what is more, it even tends to become explosive if it is operated beyond its capacity. Hence, every battery cell needs a protection circuit and a design of a high accuracy overvoltage protection circuit becomes important.

The power consumption of a protection circuit is only several microamperes. Each of these ICs usually comprises three voltage detection circuits, a short circuit detection circuit, reference voltage sources, an oscillator, a counter circuit and a control circuit. Normally, there are two implementations.

One is a continuous mode, a working principle of which can be explained by referring to FIG. 1. As shown in FIG. 1, two ladder resistors R3 and R4 are provided for dividing a battery voltage, and a voltage comparator is provided for comparing a divided battery voltage of the two ladder resistors and a reference voltage of the reference voltage source. When the divided battery voltage is higher than the reference voltage, the voltage comparator outputs a low level to enable the oscillator and the internal control circuit. After counting a predetermined number of clocks, the control circuit generates a control signal COUT to prohibit the charge of the battery.

The continuous mode means that the voltage comparator, the voltage divider and the reference voltage are always on. To reduce the power consumption, it demands that every current path in the protection circuit is very small (e.g. many current paths flow in dozens of nano-amperes) and all transistors stay in a sub-threshold region. Taking a current mirror as an example, the output current is exponentially depending on a gate-source voltage. The demand for the process model is very critical, and the circuit operating under the sub-threshold region is weak and not reliable. Generally, they are susceptible to process variation and noise interference.

The other method is a scan mode. The oscillator is always on and the system detects various abnormal conditions, such as overcharging, overdischarging and overcurrent one by one for some clocks. The voltage detectors are turned on only once for several clocks. At other times, the voltage detector is turned off to save power consumption.

However, the voltage of node's operation point in the voltage detector is noncontinuous in the scan mode. In off-time of one period, gates of p-type MOS transistors in the voltage detection circuit or commonly are pulled high to the power supply, and gates of n-type MOS transistor in the voltage detector commonly are pulled low to the ground so that the voltage detector is disabled for saving power consumption. In on-time of one period, the gates of p-type MOS transistors in the voltage detector are pulled low to the working voltage from the power supply, and the gates of n-type MOS transistor in the voltage detector are pulled high to the working voltage from the ground so that the voltage detector is enabled for properly operation. It takes too much time to recover the proper operation of the voltage detector from the off-time state and reduces the normal operating time of the voltage detector. For the reason above, there is an offset between a transient overvoltage threshold and a DC threshold. Moreover, because the delay time is affected by process and temperature etc, this would impact the accuracy of the overvoltage protection threshold.

Thus, improved techniques for an accurate voltage detection circuit are needed.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention is related to the designs of an accurate scan-mode voltage detection circuit. In one embodiment, the voltage detection circuit comprises:
first and second transistors, gates of the first and second transistors coupled to each other, sources of the first and second transistors coupled to each other, the gate of the first transistor coupled to a drain of the first transistor;
a first switch circuit configured for selectively coupling a positive voltage to the sources of the first and second transistors;
first and second bipolar transistors, bases of the first and second bipolar transistors coupled to each other, a collector of the first bipolar transistor coupled to the drain of the first transistor, a collector of the second bipolar transistor coupled to a drain of the second transistor; and
a pair of resistors coupled in series between an emitter of the first bipolar transistor and a negative power, an emitter of the second bipolar transistor coupled to an intermediate node between the pair of resistors, wherein the base of the first bipolar transistor is regarded as a detection voltage input, and the collector of the second bipolar transistor is regarded as a detection result output.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Figure 2:
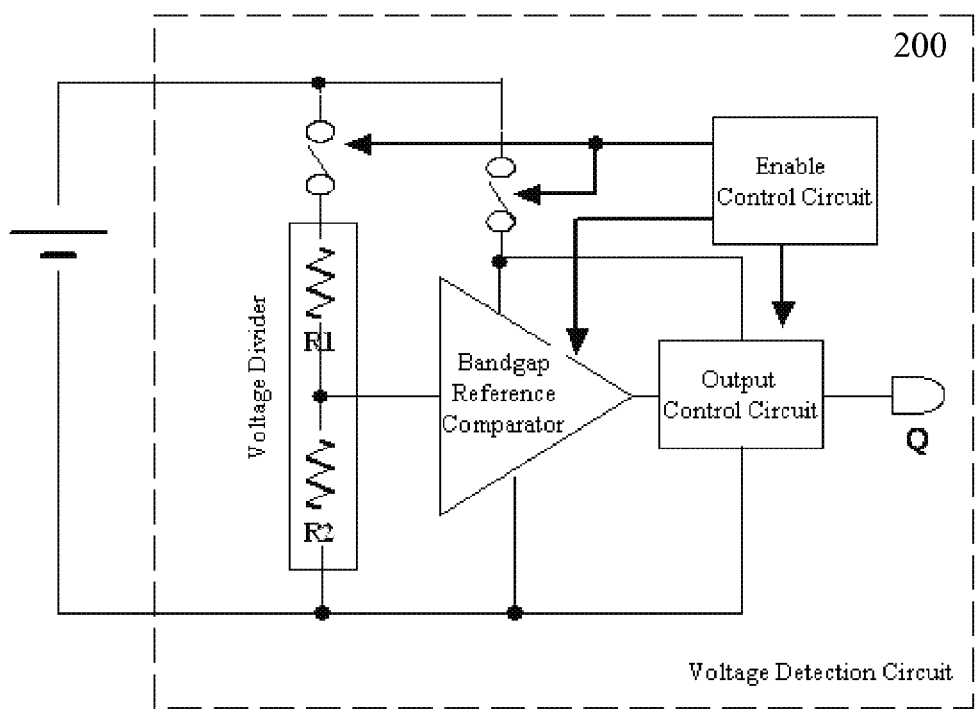
FIG. 2 is a block diagram of a voltage detection circuit according to one embodiment of the present invention.
Figure 3:
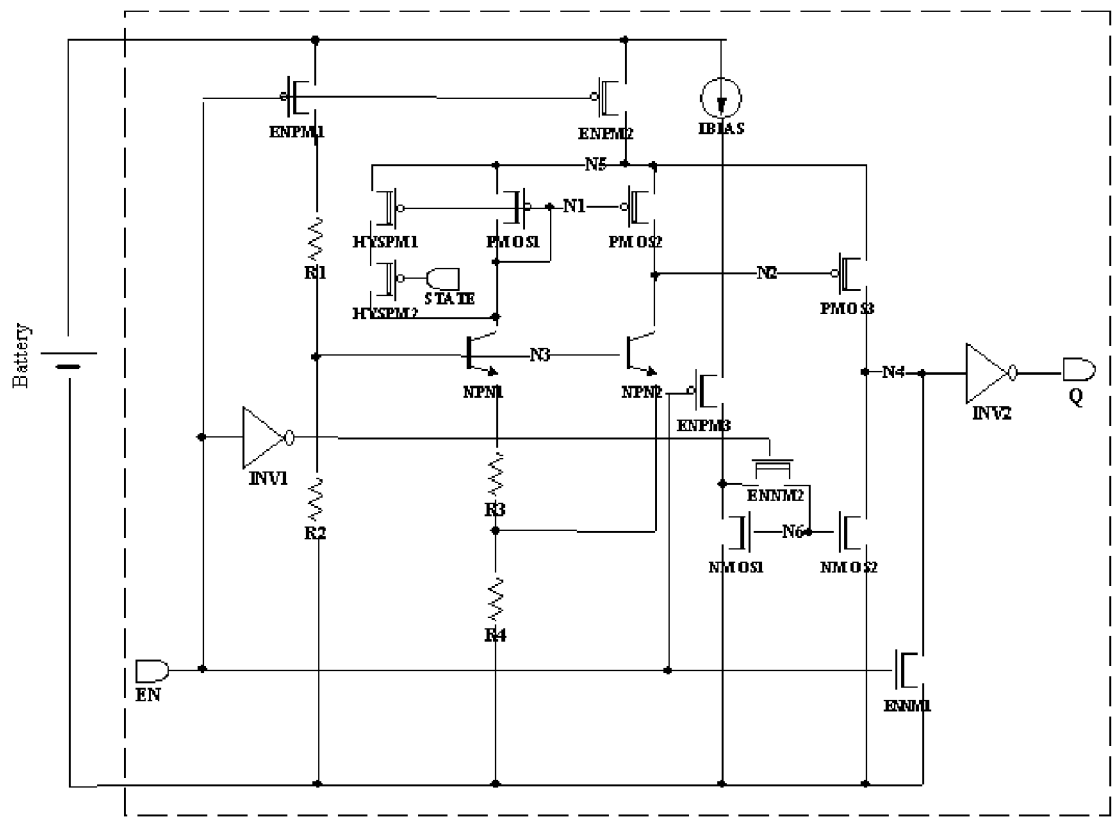
FIG. 3 is a circuit diagram showing a practical implement of the voltage detection circuit shown in FIG. 2.

Embodiments of the present invention are discussed herein with reference to FIGS. 2-3. However, those skilled in the art will readily appreciate that the detailed description given herein with respect to these figures is for explanatory purposes only as the invention extends beyond these limited embodiments.

FIG. 2 shows a voltage detection circuit 200 according to one embodiment of the present invention. A scan mode is used in the voltage detection circuit 200. An oscillator is always on and a system including the voltage detection circuit detects various abnormal conditions, such as overcharging, overdischarging and overcurrent one by one for some clocks. The voltage detection circuit 200 is turned on only once for several clocks. The on-time is very short and lasts about only one tenth of a clock cycle time. In other times, the voltage detection circuit is turned off to save power consumption. As is known, the power consumption in a system is an average over the time. So, the power consumption in a voltage detection circuit during its operating may be designed much larger (about more than ten microamperes) and the average current consumption can still be maintained very low at the same time. Thus, all transistors in the voltage detection circuit of the present invention can stay in a saturation region during an operating period, thereby making the design process much easier and making the circuit much more robust.

In one embodiment, the voltage detection circuit 200 is provided for detecting a battery voltage of a chargeable battery and comparing the detected battery voltage with a protection voltage threshold. If the detected battery voltage is larger than the protection voltage threshold, it indicates the battery is overcharged, the voltage detection circuit 200 outputs the comparative result to switch off the charge to the battery; otherwise, the voltage detection circuit 200 outputs a comparative result to keep the switch on so the charge to the battery is in progress.

The voltage detection circuit 200 comprises a voltage divider, a bandgap reference comparator, an output control circuit and an enable control circuit. All circuits are coupled between a positive terminal and a negative terminal of the battery to form a plurality of branches. The voltage divider is configured for providing a divided voltage representative of the battery voltage. The bandgap reference comparator is configured for comparing the divided voltage with a reference voltage formed therein and outputting a comparative result. The output control circuit is configured for amplifying and shaping the comparative result to get a detection result Q. The enable control circuit is configured for switching on every branch for properly operation during on-time of the scan-mode, and switching off every branch to save power consumption during off-time of the scan-mode. When every branch is switched off, voltages of some key internal nodes of the voltage detection circuit 200 are maintained for restarting the voltage detection circuit 200 quickly during a next on-time of the scan-mode.

FIG. 3 is a circuit diagram showing an exemplary implementation of the voltage detection circuit shown in FIG. 2. The voltage divider comprises two ladder resistors R1 and R2 coupled in series between the positive terminal and the negative terminal of the battery. A voltage on an intermediate node between the resistors R1 and R2 is taken as the divided voltage representative of the batter voltage. A switch ENPM1 is connected in series between the resistor R1 and the positive terminal of the battery.

The bandgap reference comparator comprises a pair of PMOS transistors PMOS1 and PMOS2, a pair of bipolar transistors NPN1 and NPN2, two resistors R3 and R4. Gates (node N1) of the transistors PMOS1 and PMOS2 are coupled with each other, sources (node N5) of the transistors PMOS1 and PMOS2 are coupled with each other, and a drain of the transistor PMOS1 is coupled with the gate of the transistor PMOS1. The sources of the transistors PMOS1 and PMOS2 are regarded as a power connection terminal of the bandgap reference comparator to be coupled to the positive terminal of the battery by a switch ENPM2. Bases (node N3) of the bipolar transistors NPN1 and NPN2 are coupled together and regarded as an input terminal of the bandgap reference comparator to be coupled to the intermediate node between the resistors R1 and R2. A collector of the bipolar transistor NPN1 is coupled to the drain of the transistor PMOS1, and a collector of the bipolar transistor NPN2 is coupled to a drain of the transistor PMOS2. The collector of the bipolar transistor NPN2 is regarded as an output terminal of the bandgap reference comparator. The resistors R3 and R4 are coupled in series. One terminal of the resistor R3 is connected to an emitter of the bipolar NPN1. One terminal of the resistor R4 is regarded as a ground connection terminal of the bandgap reference comparator to be connected to the negative terminal of the battery. An emitter of the bipolar NPN2 is coupled to an intermediate node between the resistors R3 and R4.

The transistors PMOS1 and transistor PMOS2 form a current mirror to provided currents for the bipolar transistors NPN1 and NPN2 respectively. Commonly, area of the emitter of the bipolar transistor NPN1 is larger than that of the emitter of the bipolar transistor NPN2. So, $V_{benpn1} < V_{benpn2}$, wherein $V_{benpn1}$ is a voltage drop between the base and the emitter of the bipolar transistor NPN1, $V_{benpn2}$ is a voltage drop between the base and the emitter of the bipolar transistor NPN2. According to FIG. 3, it can be seen that $V_{benpn1} + V_{R3} = V_{benpn2}$, $V_{R3}$ is a voltage drop on the resistor R3. So, $I = V_{R3}/R3 = V_{benpn2} - V_{benpn1}/R3 = \Delta V_{be}/R3$, wherein I is a current flowing through the resistor R3. A voltage drop on the resistor R4 is equal to $2*R4*\Delta V_{be}/R3$.

In operation, if the voltage (the divided voltage from the voltage divider) on the gate (node N3) of the bipolar transistor NPN2 is larger than the reference voltage $V_{REF}$, the current flowing through the bipolar transistor NPN2 may be larger than that flowing through the transistor PMOS2 so that the voltage on the collector of the bipolar transistor NPN2 is pulled down, wherein $V_{REF} = V_{benpn2} + 2*R4*\Delta V_{be}/R3$. In another word, if the batter is overcharged, the divided voltage representative of the battery voltage may be larger than the reference voltage $V_{REF}$, then the bandgap reference comparator outputs a low level which indicates the battery is overcharged. At this state, the protection voltage threshold of the battery voltage may be $$V_{OC} = \frac{R1 + R2}{R2} * (V_{benpn2} + 2 * R4 * \Delta V_{be}/R3).$$

Accordingly, if the battery voltage is less than the protection voltage threshold $V_{OC}$, namely the divided voltage is less than $V_{REF}$, the current flowing through the bipolar transistor NPN2 may be less than that flowing through the transistor PMOS2 so that the voltage on the collector of the bipolar transistor NPN2 is pulled up. Thus, the bandgap reference comparator outputs a high level which indicates that the battery is not overcharged.

The output control circuit comprises an amplifier circuit for amplifying the output signal of the bandgap reference comparator and shaping the amplified output signal of the bandgap reference to get the final voltage detection result Q.

The amplifier circuit comprises a pair of NMOS transistors NMOS1 and NMOS2, a PMOS transistor PMOS3, and a bias current source IBIAS. Gates (node N6) of the transistors NMOS1 and NMOS2 are coupled with each other, and sources of the transistors NMOS1 and NMOS2 are coupled to the negative terminal of the battery. The gate of the transistor NMOS1 is coupled to a drain of the transistor NMOS1 by a switch ENNM2. The drain of the transistor NMOS1 is connected to an output terminal of the bias current source IBIAS by a switch ENPM3. An input terminal of the bias current source IBIAS is connected to the positive terminal. A gate (node N2) of the transistor PMOS3 is regarded as an input terminal of the amplifier circuit to be connected to the output terminal of the bandgap reference comparator. A source of the transistor PMOS3 is connected to the positive terminal of the battery by the switch ENPM2. A drain of the transistor PMOS3 is connected to the drain of the transistor NMOS2. The drain of the transistor PMOS3 is regarded as an output terminal of the amplifier circuit.

The transistors NMOS1 and NMOS2 form a current mirror. The current mirror as well as the bias current source IBIAS provides a bias current for the transistor PMOS3. The transistor PMOS3 amplifies the output signal of the bandgap reference comparator. An inverter INV2 is used as the shaping circuit in one embodiment. An input terminal (node N4) of the inverter is connected to the drain of the transistor PMOS3. The inverter output the final detection result. The input terminal of the inverter is connected to the negative terminal of the battery by a switch ENNM1.

The enable control circuit is composed of the switches ENPM1, ENPM2, ENPM3, ENNM1 and ENNM2, and an inverter INV1. An enable signal EN is connected to control terminals of the switches ENPM1, ENPM2 and ENPM3, and is connected to control terminals of the switches ENNM1, ENNM2 by the inverter INV1. PMOS transistors are used as the switches ENPM1, ENPM2 and ENPM3, and NMOS transistors are used as the switches ENNM1 and ENNM2. By driving the switches ENPM1, ENPM2, ENPM3, ENNM1 and ENNM2, it is realized to switch on every branch for properly operation during on-time of the scan-mode, and switch off every branch to save power consumption during off-time of the scan-mode. The enable signal is a clock cycle signal from the battery protection chip system.

In operation, when in the on-time of the scan-mode, the enable signal is low level, the transistors ENPM1, ENPM2, ENPM3 and ENNM2 are switched on, the transistors ENNM1 are switch off. As a result, the voltage detection circuit works normally. The voltage drop on the transistor ENNM1 is too small to be neglected. The switch on of the transistors ENPM2, ENPM3 and ENNM2 ensure that the bandgap reference comparator and the amplifier circuit work normally. The switch off of the transistor ENNM1 ensures that the output of the inverter INV2 can reflect the detection result normally.

When in the off-time of the scan-mode, the enable signal is high level, the transistors ENPM1, ENPM2, ENPM3 and ENNM2 are switched off, and the transistors ENNM1 are switch on. The transistor ENPM1 is used to switch off the current path of the voltage divider. The transistor ENPM2 is used to switch off the current path of the bandgap reference comparator, and the amplifier circuit. The transistor ENPM3 is used to switch off the current path of the bias current source IBIAS. The transistor ENNM1 is used to determine the input state of the inverter INV2 to prevent it from being in an intermediate state. The transistor ENNM2 is used to switch off the discharging path of the gates of the transistor NMOS1 and NMOS2.

Furthermore, after the transistor ENPM2 is switched off, the voltage on the node N3 is discharged to the ground via the resistor R3 and R4, and the bipolar transistors NPN1 and NPN2 is turned off. As a result, the voltages of the nodes N1, N2, are maintained to be near to an operation voltage at the normal operating time. Similarly, after the transistor ENNM2 is switched off, the current path of the node N6 to the ground is turned off. As a result, the voltage of the nodes N6 is maintained to be near to the operation voltage at normal operating time. This can increase the normal operating time and reduce the offset between the transient threshold and the DC threshold due to the delay time, thus improving the threshold detection accuracy.

Figure 1:
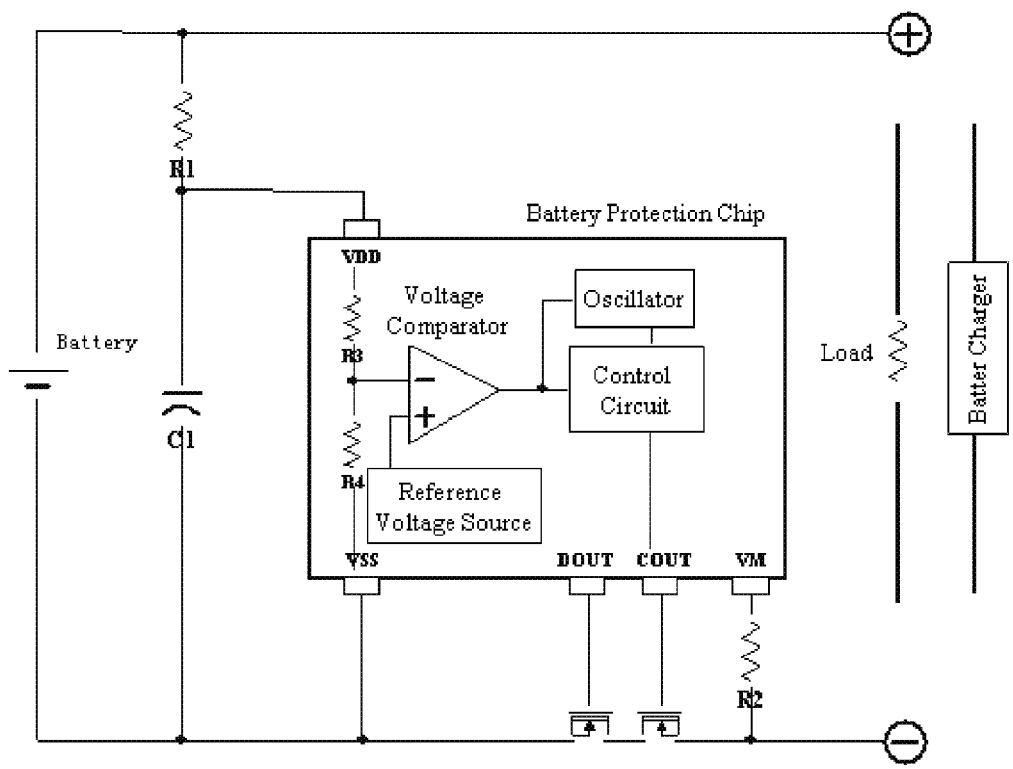
FIG. 1 is a block diagram of a conventional battery protection circuit.

Another problem is that if the power consumption at the overvoltage state is larger than that at the normal state, the control output COUT will oscillate around the protection voltage threshold. The oscillation reason is explained hereafter by referring to FIG. 1. In operation, if the detected voltage of the voltage detection circuit is larger than the voltage protection threshold, the control output COUT will become the low level from the high level to prohibit the charge to the battery; otherwise, the control output COUT will become the high level to allow the charge to the battery. The control output COUT is obtained by processing the voltage detection result of the voltage detection circuit. The resistor R1 and the capacitor C1 are configured for filtering noise in the battery voltage. When the battery voltage is increased to the voltage protection threshold slowly, the control output COUT becomes the low level from the high level and the system enters into the overvoltage state. However, if the power consumption at the overvoltage state is larger than that at the normal state, the voltage drop on the resistor R1 is larger at the overvoltage state, and the detected voltage of the voltage detection circuit becomes smaller. This will cause the detected voltage to be smaller than the voltage protection threshold, the control output COUT becomes the high level again and the system enters into the normal state. Then, the power consumption becomes small and the voltage drop on the resistor R1 becomes small again. The detected voltage of the voltage detection circuit becomes higher and will be detected as the overvoltage state, and the control output COUT becomes the low level again. Such-and-such COUT will be probed like oscillation. Even if the power consumption at the overvoltage state isn't larger than at the normal state, the control output COUT also may be unstable due to the voltage ripple or imported noise.

To overcome this problem, a hysteresis circuit controlled by the state signal is added in the voltage detection circuit. The hysteresis circuit is composed of a pair of PMOS transistors HYSPM1 and HYSPM2. A gate of the transistor HYSPM1 is connected to the gate of the transistor PMOS1, a source of the transistor HYSPM1 is connected to the source of the transistor PMOS1, a drain of the transistor HYSPM1 is connected to a source of the transistor HYSPM2. A drain of the transistor HYSPM2 is connected to the drain of the transistor PMOS1, a gate of the transistor HYSPM2 is connected to the state signal. The state signal comes from the control output COUT.

In operation, when the detected voltage of the voltage detection circuit is higher than the voltage protection threshold, the state signal becomes the low level to switch on the transistor HYSPM2. At this state, the transistor HYSPM1 connects with the transistor PMOS1 in parallel so that the voltage protection threshold in the overcharge state is less than the voltage protection threshold in the normal state. This will cancel the battery voltage variation on IC due to the voltage dropping on R1 and the noise interference.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. A voltage detection circuit comprising:
   first and second transistors, gates of the first and second transistors coupled to each other, sources of the first and second transistors coupled to each other, the gate of the first transistor coupled to a drain of the first transistor;
   a first switch circuit configured for selectively coupling a positive voltage to the sources of the first and second transistors;
   first and second bipolar transistors, bases of the first and second bipolar transistors coupled to each other, a collector of the first bipolar transistor coupled to the drain of the first transistor, a collector of the second bipolar transistor coupled to a drain of the second transistor;
   a pair of resistors coupled in series between an emitter of the first bipolar transistor and a negative power, an emitter of the second bipolar transistor coupled to an intermediate node between the pair of resistors, wherein the base of the first bipolar transistor is regarded as a detection voltage input, and the collector of the second bipolar transistor is regarded as a detection result output.

2. The voltage detection circuit according to claim 1, further comprising a voltage divider, wherein
   one terminal of the voltage divider is coupled to the positive power by a second switch circuit in series, the other terminal of the voltage divider is coupled to the negative power, and
   the voltage divider is configured for providing a divided voltage to the detection voltage input, and the second switch circuit is configured for selectively coupling the positive power to the voltage divider.

3. The voltage detection circuit according to claim 2, further comprising an amplifier circuit including a bias current source, a gain amplifying transistor, and third and fourth transistors, wherein
   gates of the third and fourth transistors are coupled with each other, sources of the third and fourth transistors are coupled to the negative power respectively, and the gate of the third transistor is coupled to a drain of the third transistor by a third switch circuit in series, the third switch circuit is configured for selectively coupling the gate of the third transistor to the drain of the third transistor;
   an input terminal of the bias current source is coupled to the positive power, an output terminal of the bias current source is coupled to the drain of the third transistor by a fourth switch circuit in series, the fourth switch circuit is configured for selectively coupling the drain of the third transistor to the output terminal of the bias current source;
   a gate of the gain amplifying transistor is coupled to the detection result output, a source of the gain amplifying transistor is coupled to the sources of the first and second transistors, and a drain of the gain amplifying transistor is coupled to a drain of the fourth transistor; and wherein the drain of the gain amplifying transistor outputs an amplified detection result.

4. The voltage detection circuit according to claim 3, further comprising an inverter serving as a shaping circuit, wherein
   an input terminal of the inverter is coupled to the drain of the gain amplifying transistor, an output terminal of the inverter output a final detection result; and
   a fifth switch circuit is coupled between the input terminal of the inverter and the negative power and is configured for selectively coupling the input terminal of the inverter to the negative power.

5. The voltage detection circuit according to claim 3, wherein the first and second transistors are p-type MOS transistor, the third and fourth transistors are n-type MOS transistors, and the gain amplifying transistor is a p-type MOS transistor.

6. The voltage detection circuit according to claim 1, wherein an area of the emitter of the first bipolar transistor is larger than that of the emitter of the second bipolar transistor.

7. The voltage detection circuit according to claim 4, wherein each of the first, second and fourth switch circuits is a p-type MOS transistor, and each of the third and fifth switch circuits is a n-type MOS transistor, wherein
   gates of the first, second, fourth and fifth switch circuits are connected to an enable control terminal;
   a gate of the third switch circuit is connected to the enable control terminal by an inverter in series.

8. The voltage detection circuit according to claim 1, further comprising a hysteresis circuit comprising a first hysteresis transistor and a second hysteresis transistor, wherein
   a gate of the first hysteresis transistor is connected to the gate of the first transistor, a source of the first hysteresis transistor is connected to the source of the first transistor;
   a source of the second hysteresis transistor is connected to a drain of the first hysteresis transistor, a drain of the second hysteresis transistor is connected to the drain of the first transistor; and
   a gate of the second hysteresis transistor is configured for receiving a state signal which is obtained according to a detection result from the detection result output.

9. A voltage detection circuit comprising:
   a voltage divider coupled between a positive terminal and a negative terminal of a battery and configured for dividing a battery voltage and providing a divided voltage of the battery voltage;
   a voltage comparator coupled between the positive terminal and the negative terminal of the battery and configured for comparing the divided voltage from the voltage divider with a reference voltage formed therein and outputting a comparative result;

an output control circuit coupled between the positive terminal and the negative terminal of the battery and configured for amplifying and shaping the comparative result to form a voltage detection result; and an enable circuit configured for receiving an enable signal to switch on current paths from the positive terminal to the negative terminal of the battery of the voltage divider, the voltage comparator and the output control circuit, or receiving a disenable signal to switch off current paths from the positive terminal to the negative terminal of the battery of the voltage divider, the voltage comparator and the output control circuit, wherein the voltage comparator and the output control circuit comprises plural MOS transistors therein, and voltages on gates of the MOS transistors are maintained to be substantially near to normal operation voltages after the current paths from the positive terminal to the negative terminal of the battery of the voltage divider, the voltage comparator and the output control circuit are switched off.

10. The voltage detection circuit according to claim 9, wherein the voltage comparator comprises:

first and second MOS transistors, gates of the first and second MOS transistors coupled with each other, sources of the first and second MOS transistors coupled with each other, the gate of the first MOS transistor coupled to a drain of the first MOS transistor, sources of the first and second MOS transistors coupled to the positive terminal of the battery by a first switch circuit, the first switch circuit configured for selectively coupling the positive terminal of the battery to the sources of the first and second MOS transistors;

first and second bipolar transistors, bases of the first and second bipolar transistors coupled with each other, a collector of the first bipolar transistor coupled to the drain of the first MOS transistor, a collector of the second bipolar transistor coupled to a drain of the second MOS transistor;

a pair of resistors coupled in series between an emitter of the first bipolar transistor and the negative terminal of the battery, an emitter of the second bipolar transistor coupled to an intermediate node between the pair of resistors, wherein the base of the first bipolar transistor is regarded as an divided voltage input of the voltage comparator, and the collector of the second bipolar transistor is regarded as a comparative result output of the voltage comparator.

11. The voltage detection circuit according to claim 10, wherein the output control circuit comprises an amplifying circuit including a bias current source, a gain amplifying MOS transistor, and third and fourth MOS transistors, and wherein gates of the third and fourth MOS transistors are coupled with each other, sources of the third and fourth MOS transistors are coupled to the negative power respectively, and the gate of the third MOS transistor is coupled to a drain of the third MOS transistor by a third switch circuit in series, the third switch circuit is configured for selectively coupling the gate of the third MOS transistor to the drain of the third MOS transistor;

an input terminal of the bias current source is coupled to the positive terminal of the battery, an output terminal of the bias current source is coupled to the drain of the third MOS transistor by a fourth switch circuit in series, the fourth switch circuit is configured for selectively coupling the drain of the third MOS transistor to the output terminal of the bias current source;

a gate of the gain amplifying MOS transistor is coupled to the comparative result output, a source of the gain amplifying MOS transistor is coupled to the sources of the first and second MOS transistors, and a drain of the gain amplifying MOS transistor is coupled to a drain of the fourth MOS transistor; and wherein the drain of the gain amplifying MOS transistor outputs an amplified comparative result.

12. The voltage detection circuit according to claim 10, wherein an area of the emitter of the first bipolar transistor is larger than that of the emitter of the second bipolar transistor.

13. The voltage detection circuit according to claim 10, wherein the voltage comparator further comprises a first hysteresis transistor and a second hysteresis transistor, wherein a gate of the first hysteresis transistor is connected to the gate of the first MOS transistor, a source of the first hysteresis transistor is connected to the source of the MOS first transistor;

a source of the second hysteresis transistor is connected to a drain of the first hysteresis transistor, a drain of the second hysteresis transistor is connected to the drain of the first MOS transistor; and a gate of the second hysteresis transistor is configured for receiving a state signal which is obtained according to the voltage detection result.

* * * * *